(12) United States Patent
Jeon et al.

(10) Patent No.: US 7,800,219 B2
(45) Date of Patent: Sep. 21, 2010

(54) HIGH-POWER SEMICONDUCTOR DIE PACKAGES WITH INTEGRATED HEAT-SINK CAPABILITY AND METHODS OF MANUFACTURING THE SAME

(75) Inventors: Oseob Jeon, Seoul (KR); Chung-Lin Wu, San Jose, CA (US); Eddy Tjhia, Sunnyvale, CA (US); Bigildis C. Dosdos, San Jose, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 330 days.

(21) Appl. No.: 11/968,602

(22) Filed: Jan. 2, 2008

(65) Prior Publication Data

US 2009/0166850 A1 Jul. 2, 2009

(51) Int. Cl.
*H01L 23/34* (2006.01)
*H01L 23/10* (2006.01)

(52) U.S. Cl. .............................. 257/706; 257/E21.499; 257/669; 257/701; 438/106; 438/107

(58) Field of Classification Search .......... 257/E21.499, 257/E23.086, 669, 694, 701, 706, 778; 438/106, 438/107, 122, 127; 363/147
See application file for complete search history.

(56) References Cited

U.S. PATENT DOCUMENTS

| | | | | |
|---|---|---|---|---|
| 5,637,922 | A * | 6/1997 | Fillion et al. | 257/728 |
| 6,350,634 | B2 | 2/2002 | Ma | |
| 6,452,802 | B2 * | 9/2002 | Lam et al. | 361/704 |
| 6,521,982 | B1 * | 2/2003 | Crowley et al. | 257/676 |
| 6,566,164 | B1 * | 5/2003 | Glenn et al. | 438/107 |
| 6,693,350 | B2 * | 2/2004 | Teshima et al. | 257/712 |
| 6,777,800 | B2 * | 8/2004 | Madrid et al. | 257/690 |
| 6,791,172 | B2 * | 9/2004 | Chen et al. | 257/678 |
| 7,034,385 | B2 * | 4/2006 | Ambrus | 257/678 |
| 7,145,224 | B2 * | 12/2006 | Kawashima et al. | 257/678 |
| 7,242,582 | B2 * | 7/2007 | Kurauchi et al. | 361/704 |
| 7,256,501 | B2 * | 8/2007 | Okamoto et al. | 257/772 |
| 7,271,477 | B2 * | 9/2007 | Saito et al. | 257/686 |
| 7,332,806 | B2 * | 2/2008 | Joshi et al. | 257/706 |
| 7,408,251 | B2 * | 8/2008 | Hata et al. | 257/678 |
| 7,557,432 | B2 * | 7/2009 | Tang et al. | 257/675 |
| 7,569,920 | B2 * | 8/2009 | Otremba et al. | 257/686 |
| 7,633,153 | B2 * | 12/2009 | Shimokawa et al. | 257/706 |
| 7,663,211 | B2 * | 2/2010 | Noquil et al. | 257/675 |
| 7,705,436 | B2 * | 4/2010 | Mahler et al. | 257/676 |

(Continued)

*Primary Examiner*—Chris Chu
(74) *Attorney, Agent, or Firm*—Townsend and Townsend and Crew LLP

(57) ABSTRACT

An exemplary semiconductor die package of the invention has a metal-oxide substrate disposed between a first surface of a semiconductor die and a heat-sinking component, with a conductive die clip or one or more electrical interconnect traces disposed between the metal-oxide substrate and the first surface of the semiconductor die. The heat-sinking component may comprise a heat sink, or an adaptor plate to which a heat sink may be coupled. The conductive die clip or electrical trace(s) provides electrical connection(s) to the first surface of the semiconductor die, while the metal-oxide substrate electrically insulates the die from the heat-sinking component, and provides a path of high thermal conductivity between the die and the heat-sinking component. The second surface of the semiconductor die may be left free to connect to a circuit board, or a leadframe or interconnect substrate may be attached to it.

9 Claims, 11 Drawing Sheets

U.S. PATENT DOCUMENTS

2005/0029651 A1* 2/2005 Tomioka et al. .............. 257/712
2006/0044772 A1* 3/2006 Miura ......................... 361/767
2006/0186551 A1* 8/2006 Lange et al. ................. 257/778
2007/0114352 A1* 5/2007 Cruz et al. ................ 248/316.7
2007/0132073 A1* 6/2007 Tiong et al. .................. 257/666

* cited by examiner

HIGH-POWER SEMICONDUCTOR DIE PACKAGES WITH INTEGRATED HEAT-SINK CAPABILITY AND METHODS OF MANUFACTURING THE SAME

CROSS-REFERENCES TO RELATED APPLICATIONS

NOT APPLICABLE

BACKGROUND OF THE INVENTION

Conventional discrete semiconductor power components are provided in packages to which heat sinks may be attached with adhesive. The packages can be made of inexpensive plastic material, but these packages have poor heat conduction capability and low temperature ratings. Alternatively, the packages can be made of ceramic material, but at substantially increased costs. Current demands in the industry are for discrete power components to handle greater amounts of power, and thus dissipate more heat, while still being inexpensive. It would be desirable to provide a way to address these conflicting demands.

BRIEF SUMMARY OF THE INVENTION

The inventors have discovered several novel ways of integrating heat-sinking capability closely with the dice of semiconductor power devices. The dice of such devices have power conduction terminals on both die surfaces, a fact that precludes attaching a conventional metal heat sink to the die since heat sinks have to be isolated from the voltages of the circuit for safety reasons.

The present invention encompasses semiconductor die packages, each having at least one semiconductor die, and metal-oxide substrate disposed between a first surface of a semiconductor die and a heat-sinking component, with a conductive die clip or one or more electrical interconnect traces disposed between the metal-oxide substrate and the first surface of the semiconductor die. The electrical traces may be provided by traces formed on the metal-oxide substrate or by a leadframe disposed between the semiconductor die and the metal-oxide substrate. The heat-sinking component may comprise a heat-sink, or an adaptor plate to which a heat sink may be coupled. The conductive die clip or electrical trace(s) provides electrical connection(s) to the first surface of the semiconductor die, while the metal-oxide substrate electrically insulates the die from the heat-sinking component, and provides a path of high thermal conductivity between the die and the heat-sinking component. The second surface of the semiconductor die may be left free to connect to a circuit board, or a leadframe or an interconnect substrate may be attached to it. An inexpensive plastic material may be molded around the semiconductor die, electrical interconnect structures and/or die clip, the metal-oxide substrate, and a portion of the heat-sinking component, which provides electrical insulation at the sides of the package.

The present invention also encompasses systems that include packages according to the present invention, each such system having an interconnect substrate and a semiconductor die package according to the present invention attached to the interconnect substrate, with electrical connections made therewith.

The present invention further encompasses methods of manufacturing a semiconductor die package having at least one semiconductor die, the at least one semiconductor die having a first surface, a second surface, a first electrically conductive region disposed on the die's first surface, and second electrically conductive region disposed on the die's second surface. A first group of exemplary methods comprises assembling the at least one semiconductor die, at least one electrical trace, and a metal-oxide substrate together such that the at least one electrical trace is disposed between the first surface of the at least one semiconductor die and a first surface of the metal-oxide substrate, such that the first electrically conductive region of the die is electrically coupled to a first portion of the at least one electrical trace, and such that the die does not occlude a second portion of the at least one electrical trace. The first group of exemplary methods further comprises assembling the metal-oxide substrate and a heat-sinking component together such that a second surface of the metal-oxide substrate and a mounting surface of a heat-sinking component face one another. A second group of exemplary methods comprises assembling a leadframe, a die clip, and the at least one semiconductor die together as a first sub-assembly, and assembling a heat-sinking component, a metal-oxide substrate, and the first sub-assembly together as a second sub-assembly such that the metal-oxide substrate is disposed between the heat-sinking component and the first sub-assembly. The leadframe has a first conductive region and a second conductive region electrically isolated from the first conductive region. The die clip has a major portion, a minor portion, and a bridge portion between the major and minor portions, with the major portion having a first surface and a second surface opposite to its first surface, and with the minor portion having a first surface and a second surface opposite to its first surface. In the first sub-assembly, the semiconductor die is assembled such that the die's first electrically conductive region is electrically coupled to the leadframe's first electrically conductive region. The die clip is assembled such that the first surface of its major portion is disposed over the second surface of the semiconductor die and electrically coupled thereto, and such that the first surface of its minor portion is disposed over the second conductive region of the leadframe and electrically coupled thereto.

Accordingly, it is an objective of the present invention to provide inexpensive semiconductor die packages with integrated heat-sinking capability.

It is another objective of the present invention to provide systems having semiconductor die packages with integrated heat-sinking capability.

It is yet another objective of the present invention to provide inexpensive methods of manufacturing semiconductor die packages with integrated heat-sinking capability.

These and other embodiments and objectives of the invention are described in detail in the Detailed Description with reference to the Figures. In the Figures, like numerals may reference like elements and descriptions of some elements may not be repeated.

DETAILED DESCRIPTION OF THE INVENTION

Figure 1:
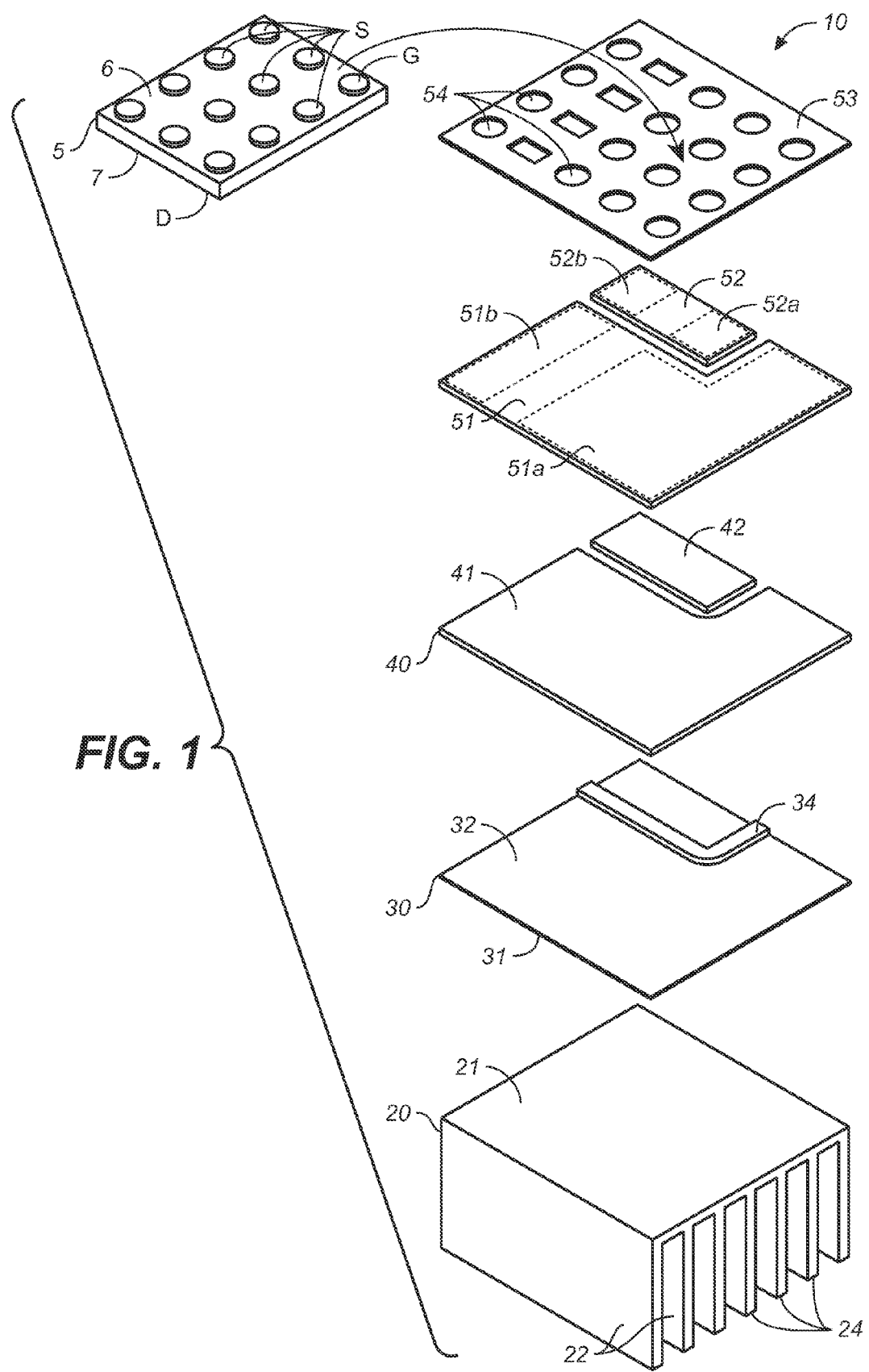
FIG. 1 shows an exploded perspective view of a first embodiment of a semiconductor die package according to the present invention.

FIG. 1 shows an exploded perspective view of a first embodiment of a semiconductor die package 10 according to the present invention. Package 10 comprises a heat sink 20 having a mounting surface 21 and a heat-radiating surface 22, with the surface area of heat-radiating surface 22 being greater than the surface area of the mounting surface 21. Mounting surface 21 is for receiving heat from one or more semiconductor die, and heat-radiating surface 22 is for radiating the received heat to a coolant, which may be in the form of a gas or liquid. The surface area of heat-radiating surface 22 is preferably twice or more the surface area of mounting surface 21, and preferably at least four times. Typically, heat-radiating surface 22 comprises a plurality of fins 24 extending away from mounting surface 21 in a generally perpendicular direction, or direction vertical to the horizontal plane of mounting surface 21. Also typically, the major portion of fins 24 is within the footprint of mounting surface 21; in other words, the horizontal extent of fins 24 is substantially within the horizontal extent of mounting surface 21.

Package 10 further comprises a metal-oxide substrate 30 having a first surface 31 disposed on mounting surface 21 of heat sink 20, and a second surface 32 opposite to first surface 31. The term substrate as used herein has its usual meaning in the packaging art, which is a broad body of material having a thin, substantially uniform, thickness (the thinness being measured relative to the broad horizontal dimensions of the substrate). A layer of thermally conductive adhesive or thermally conductive grease may be disposed between the substrate's second surface 32 and the heat sink's mounting surface 21. If thermally conductive grease is used, or no adhesive is used to attach substrate 30 to heat sink 20, a housing may be molded around these components to hold them in place, as described below in greater detail. (Another option, although more expensive, is to metalize the substrate's second surface 32 and attach it to the heat sink's mounting surface 21 with solder.) Metal-oxide substrate 30 preferably has a thermal conductivity of at least 5 W/m·° K, and preferably of at least 10 W/m·° K, and more preferably of at least 15 W/m·° K. In comparison, epoxies and siloxanes used in conventional packages have thermal conductivities well below 1 W/m·° K. All thermal conductivity values provided herein are measured at 300° K (approximately room temperature). Metal-oxide substrate 30 may comprise any suitable metal-oxide material or combinations of metal-oxide materials. Substrate 30 preferably comprises alumina (also called aluminum oxide), and may be formed by a green sheet fabrication process conventionally used to form ceramic substrates. Alumina with 99.5% purity has a thermal conductivity of 35 W/m·° K, and common commercial grades of alumina with 94% to 96% purity have thermal conductivities in the range of ~18 W/m·° K to ~25 W/m·° K. Preformed alumina substrates may be commercially purchased, and may be cut to a desired size (e.g., diced to a desired size). In typical implementations, metal-oxide substrate 30 has a thickness in the range of about 0.1 millimeters to about 1 millimeter, and preferably in the range of about 0.2 millimeters to 0.625 millimeters. In preferred embodiments of package 10, the planar extent of metal-oxide substrate is substantially the same as the horizontal extent of mounting surface 21 of heat sink 20, or less. Metal-oxide substrate 30 is electrically insulating, and serves to electrically isolate voltages and current of the semiconductor die 5 and any interconnects from heat sink 20, while providing a path of high thermal conductivity between the die and the heat sink.

Package 10 preferably further comprises an adhesion layer 40 disposed over the second surface of metal-oxide layer 30. Adhesion layer 40 provides an adhesive layer on which to form electrical interconnect traces that do not adhere well to metal-oxide substrate 30. Generally, a good adhesive material for layer 40 comprises the metal or metals present in metal-oxide substrate 30, or alloys of such metals. For example, when substrate 30 comprises alumina, a good adhesive material for layer 40 is aluminum and alloys thereof. When adhesion layer 40 is formed of an electrically conductive material, it is patterned to follow the form of the electrical traces so they can be electrically insulated from one another. Adhesion layer 40 is illustrated in the figure as having two traces 41 and 42, whose forms follow these electrical interconnect traces. Adhesion layer 40 may be formed on the second surface of metal-oxide layer 30 by any conventional surface formation process, such as deposition, sputtering, etc., and metal plating (when adhesion layer 40 comprises metal), and traces 41 and 42 can be defined in layer 40 by any conventional etching process. Layer 40 and traces 41 and 42 may also be integrally formed with substrate 30 in a green-sheet formation process where the green-sheet for layer 40 is formed over the green-sheet for substrate 30, and the two layers are thereafter pressed together during a sintering step. The pressing operation may cause a ridge 34 of insulating material to be formed between traces 41 and 42, as shown in FIG. 1. Ridge 34 is optional (since layer 40 may be pattern etched after sintering), and is not needed to make and use the present invention.

Package 10 further comprises a plurality of electrical interconnect traces 51 and 52 disposed over traces 41 and 42, respectively, of adhesion layer 40, if present, and further over metal-oxide substrate 30. Trace 51 has a first portion 51a that will serve to connect to one or more pads of a semiconductor die, and a second portion 51b that will serve to provide an external terminal for package 10. Similarly, trace 52 has a first portion 52a that will serve to connect to one or more pads of a semiconductor die, and a second portion 52b that will serve to provide an external terminal for package 10. In one exemplary implementation of package 10, a trace 51 provides an electrical connection to a conduction terminal (e.g., drain) of a semiconductor power device, and trace 52 provides an electrical connection to a modulation terminal (e.g., gate) of the semiconductor power device. A patterned solder mask 53 is formed over traces 51 and 52 to provide defined areas 54 where connections between a semiconductor die 5 and portions 51a and 52a may be made, and where external connections to portions 51b and 52b may be made. Electrical interconnect traces 51-52 comprise an electrically conductive metal, or combination of metal layers. In one preferred implementation, traces 51-52 comprise copper, with an optional metallic barrier layer formed between the copper and the aluminum of traces 41-42. Traces 51-52 can be formed by conventional layer formation processes, including such processes as sputtering, plating, deposition, foil lamination, and etching.

Package 10 further comprises a semiconductor die 5 having a first surface 6, a second surface 7, a first electrically conductive region G disposed on the die's first surface 6, a second electrically conductive region D disposed on the die's second surface 7, and a plurality of third electrically conductive regions S disposed on the die's first surface. In one implementation of package 10, semiconductor die 5 comprises a power transistor device having a gate terminal (i.e., a modulation terminal) provided at conductive region G, a source terminal (i.e., a first conduction terminal) provided at conductive region S, and a drain terminal (i.e., a second conduction terminal) provided at conductive regions D. Semiconductor die 5 is disposed over traces 51 and 52 and metal-oxide substrate 30 such that conductive region G is electrically coupled to first portion 52a of electrical trace 52, such that conductive regions S are electrically coupled to first portion 51a of electrical trace 51, and such that die 5 does not occlude the second portions 51b and 52b of electrical traces 51 and 52. In other implementations, the positions of the source and drain are swapped on semiconductor die 5, and thus the positions of conductive regions S and D are swapped.

The dice in the semiconductor die packages according to embodiments of the invention may include any suitable semiconductor device, including power transistors or other types of devices which have at least one input terminal at one surface and an output terminal at the opposite surface. Such devices may be characterized as being "vertical" devices. Examples of some vertical devices include vertical power MOSFETs, vertical diodes, VDMOS transistors, vertical bipolar transistors, etc. Suitable semiconductors include silicon, silicon carbide, Gallium-Arsenide, and other so called "III-V," "II-VI," and "compound" semiconductor materials.

Figure 2:
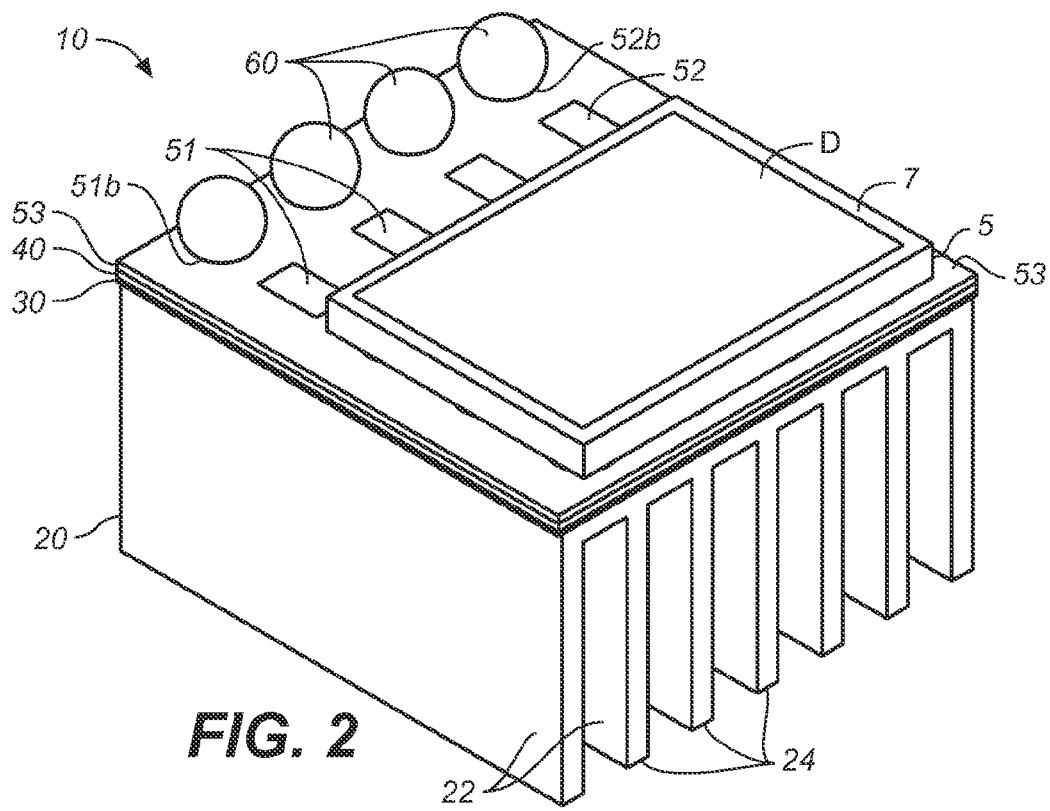
FIGS. 2 and 3 show perspective views of the first exemplary semiconductor die package, in assembled form, according to the present invention.
Figure 3:
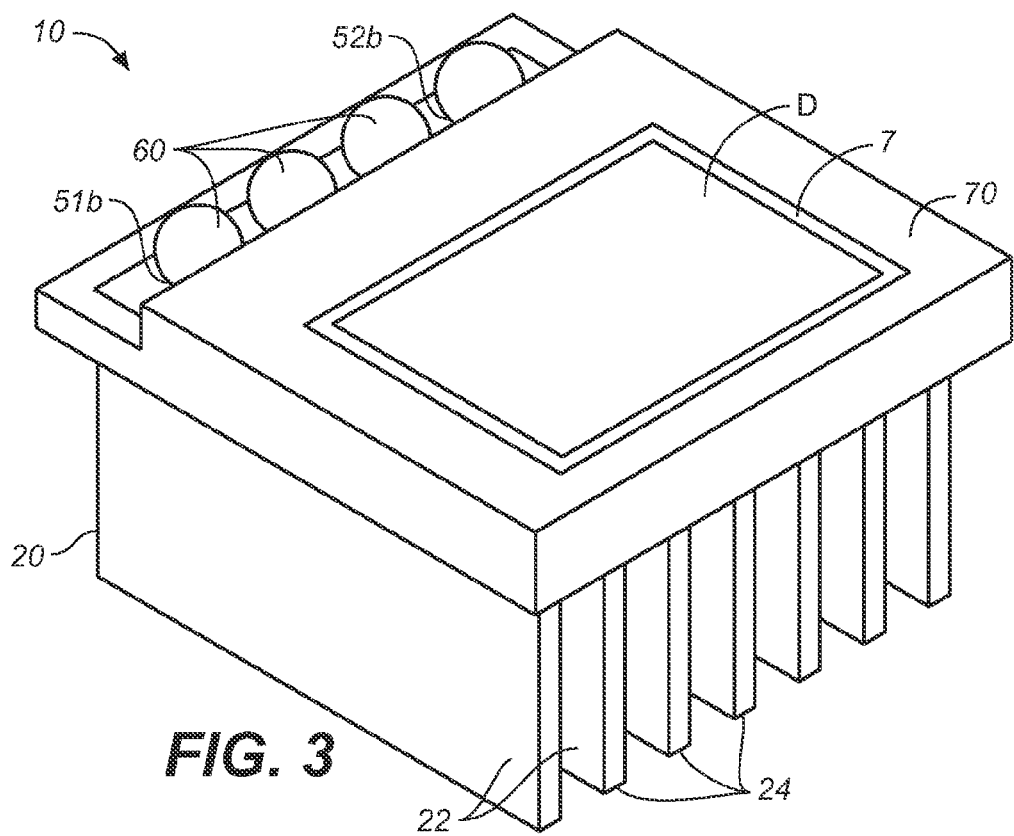

FIG. 2 shows a perspective view of semiconductor die package 10, where solder bumps 60 have been adhered to the portions 51b and 52b of the traces 51-52 that have been exposed by solder mask 53. In a typical assembly sequence, components 30-53 are first assembled, then semiconductor die 5 is attached to traces 51 and 52, and this assembly is then assembled with heat sink 20. FIG. 3 shows a perspective view of semiconductor die package 10 after a body of electrically insulating material has been formed around substrate 30 and die 5 to form a housing 70. Housing 70 preferably leaves conductive region D on the die's second surface 7 exposed so that electrical contact may be made to it. Housing 70 may also be formed to cover portions of the base of heat sink 20; this can lock heat sink 20 and substrate 30 in place in the case that no adhesive has been disposed between these two components. The other reference numbers shown in the figures were previously discussed with reference to FIG. 1.

As a variation of package 10, a leadframe may be used to provide traces 51 and 52. The leadframe may be adhered or contacted to adhesion layer 40, or adhered or contacted to metal-oxide substrate 30 without the presence of adhesion layer 40. The manufacturing method for this implementation may comprise assembling the leadframe and die together by conventional leadframe attachment methods, and assembling the leadframe, the metal-oxide substrate, and heat-sinking component together.

Figure 4:
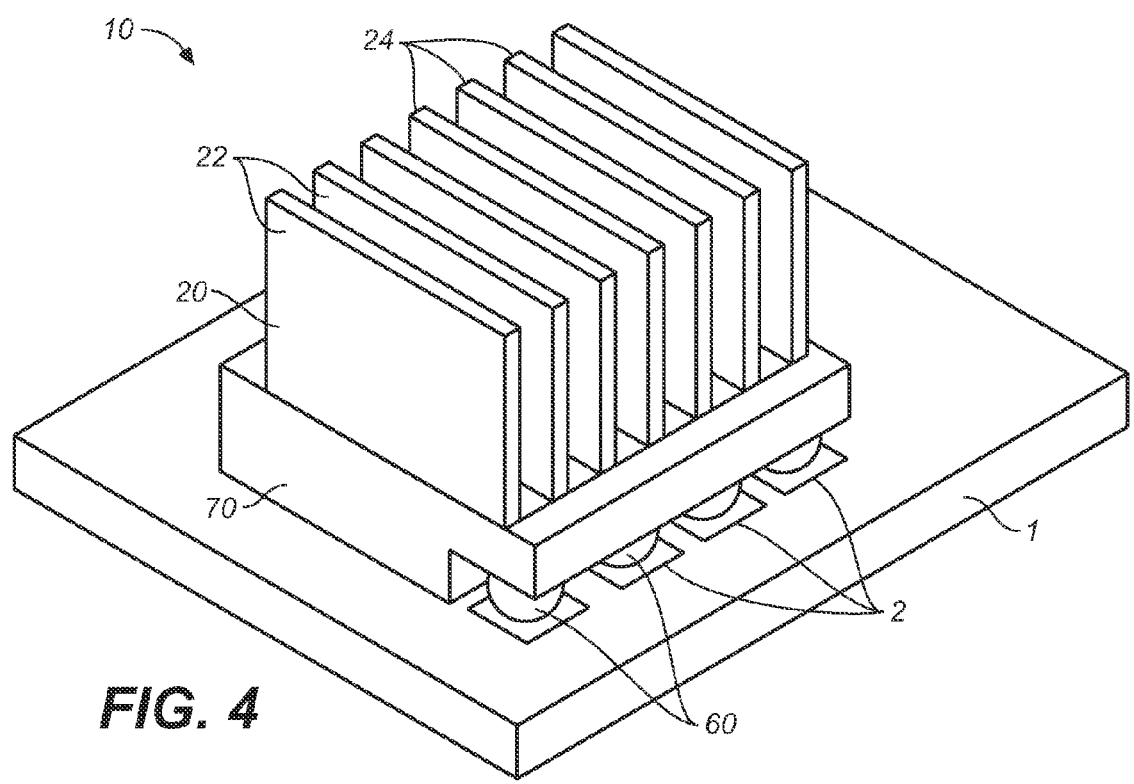
FIG. 4 shows a perspective view of the first exemplary semiconductor die package, in assembled form, as attached to an interconnect substrate of a system according to the present invention.

FIG. 4 shows a perspective view of semiconductor die package 10 as attached to an interconnect substrate 1. Interconnect substrate 1 may comprise a board, flexible circuit, or the like, may have additional packages attached thereto, and may be comprised by a system or may comprise a complete system along with the packages attached thereto. Solder bumps 60 have been reflowed and electrically coupled to respective conductive pads 2 of interconnect substrate 1. While not shown in the figure, conductive region D of die 5 has been electrically coupled to corresponding conductive pad 2 on the top surface of interconnect board.

Having thus described package 10, it may be appreciated that heat generated by semiconductor die 5 is coupled to heat sink 20 by way of conductive regions G and S, traces 51 and 52, adhesion layer 40, and substrate 30. Traces 51-52 typically have a thermal conductivity greater than that of metal-oxide substrate 30, and thus serve to spread out the heat conducted by conductive regions G and S onto adhesion layer 40 and substrate 30. For example, the thermal conductivity of copper (which may be used for traces 51-52) is ~400 W/m·°K, which is ten to twenty times higher than that of alumina (which may be used for substrate 30). Adhesion layer 40 may also act as a thermal spreading layer when its thermal conductivity is greater than that of substrate 30. As indicated above, adhesion layer 40 may comprise aluminum or an aluminum alloy, which have thermal conductivities in the rage of 200 W/m·°K to 240 W/m·°K.

Figure 5:
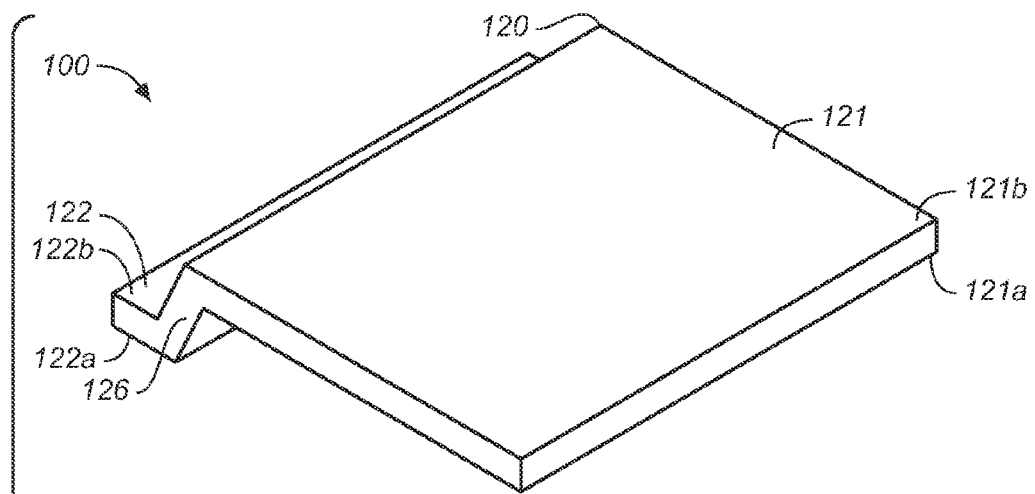
FIGS. 5 and 6 show exploded perspective views of a second embodiment of a semiconductor die package according to the present invention.
Figure 5:
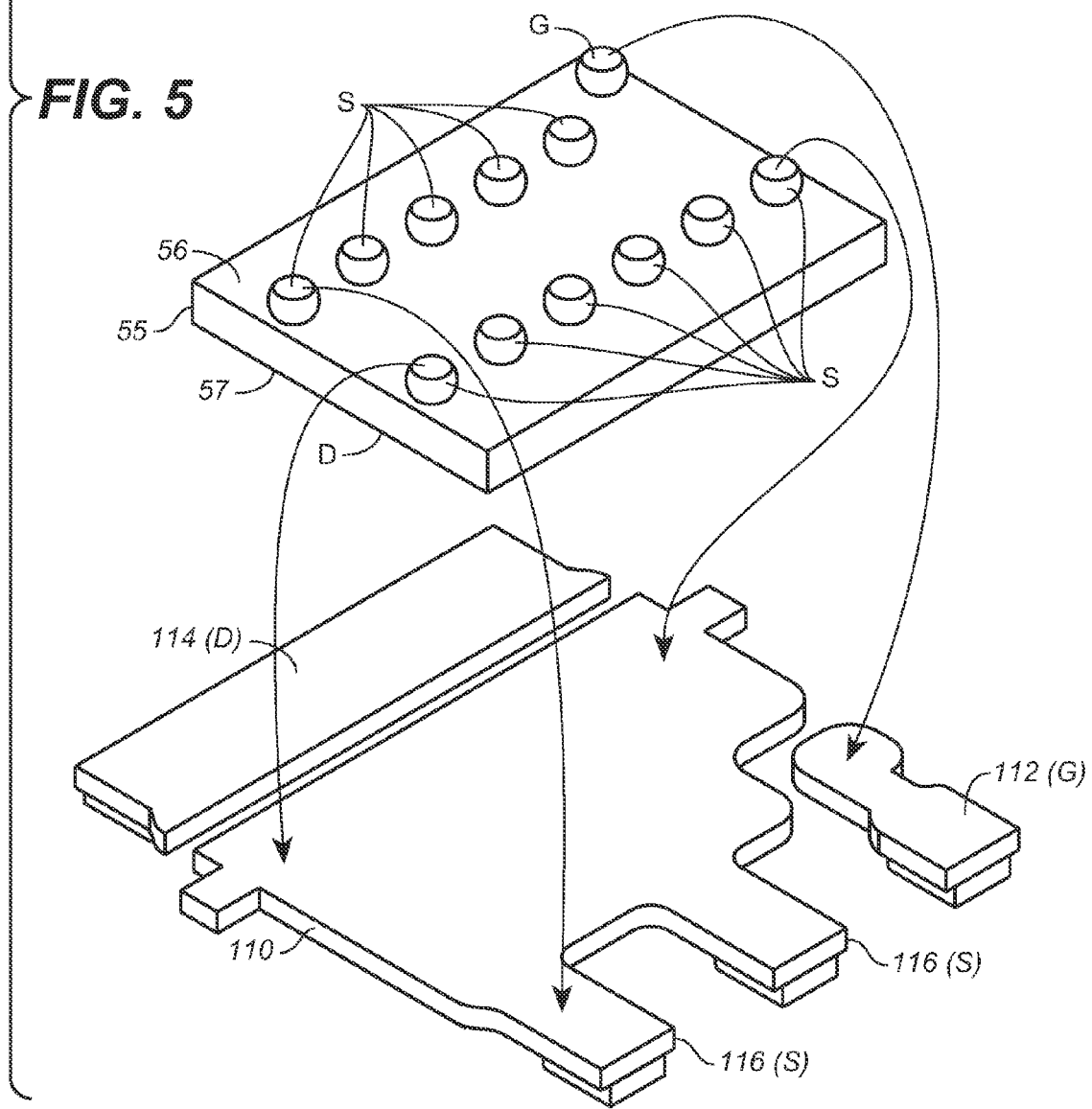
Figure 6:
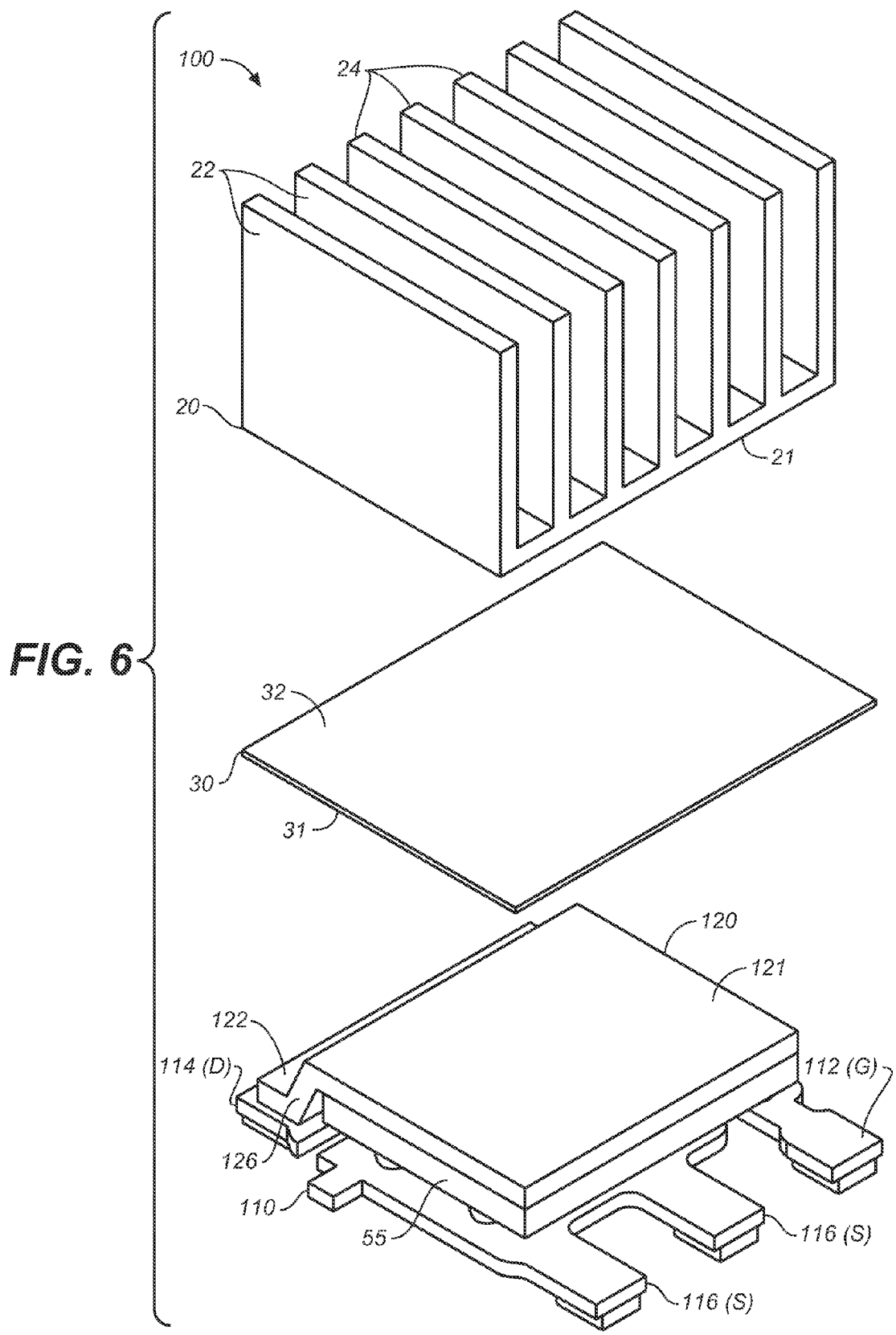

FIGS. 5 and 6 show exploded perspective views of a second embodiment of a semiconductor die package 100 according to the present invention. Referring to FIG. 5, package 100 comprises a leadframe 110 having a first conductive region 112, a second conductive region 114 that is electrically isolated from first conductive region 112, and a third conductive region 116 that is electrically isolated from the first and second conductive regions 112 and 114. Leadframe 110 may comprise a base layer of copper (Cu) that is coated or alloyed with one or more metal layers, such as metal layers of nickel (Ni), palladium (Pd), and gold (Au). Package 100 further comprises a semiconductor die 55 having a first surface 56, a second surface 57, a first electrically conductive region G disposed on the die's first surface 56, a second electrically conductive region D disposed on the die's second surface 57, and a plurality of third electrically conductive regions S disposed on the die's first surface 56. In one implementation of package 100, semiconductor die 55 comprises a power transistor device having a source terminal (i.e., a first conduction terminal) provided at conductive region S, and a drain terminal (i.e., a second conduction terminal) provided at conductive regions D, and a gate terminal (i.e., a modulation terminal) provided at conductive region G. Semiconductor die 55 is disposed over leadframe 110 such that the die's first electrically conductive region G is attached and electrically coupled to the leadframe's first electrically conductive region 112, and such that the die's set of third electrically conductive regions S are attached and electrically coupled to the leadframe's third conductive region 116. Solder may be used to attach the conductive regions together.

Package 100 further comprises a die clip 120 (also called a "drain clip") that has a major portion 121, a minor portion 122, and a bridge portion 126 between major portion 121 and minor portion 122. Major portion 121 has a first surface 121*a* disposed over the second surface 57 of semiconductor die 55 and electrically coupled to conductive region D, and a second surface 121*b* opposite to its first surface 121*a*. Conductive region D may comprise a metal surface layer, and solder may be used to attach it to surface 121*b* of the clip's major portion 121. Minor portion 122 has a first surface 122*a* disposed over the second conductive region 114 of leadframe 110, attached thereto, and electrically coupled thereto, such as by solder. Minor portion 122 also has a second surface 122*b* substantially opposite to its first surface 122*a*. Die clip 120 comprises one or more metals, and preferably comprises a base copper layer, which may be coated or alloyed with metal sub-layers that enhance solderability, such as nickel (Ni), palladium (Pd), and gold (Au), or a combination thereof. In one exemplary assembly sequence, die 55 and leadframe 110 are aligned and then attached together (such as by a first solder reflow operation), and thereafter die clip 120 is aligned to both die 55 and leadframe 110 and then attached thereto (such as by a second solder reflow operation). In a second exemplary assembly sequence, die clip 120 and die 55 are aligned and attached (such as by a first solder reflow operation), and thereafter these components are aligned and attached to leadframe 110 (such as by a second solder reflow operation). In a third exemplary assembly sequence, all three components are aligned to one another, and then simultaneously attached (such as in a single solder reflow operation). FIG. 6 shows components 55, 110, and 120 in assembled form.

Referring to FIG. 6, package 100 further comprises a metal-oxide substrate 30 as previously described, with its first surface 31 disposed on the second surface of the major portion 121 of die clip 120. As before, metal-oxide substrate 30 preferably has a thermal conductivity of at least 5 W/m·°K, and preferably of at least 10 W/m·°K, and more preferably of at least 15 W/m·°K, all thermal conductivity values provided herein being measured at 300° K (approximately room temperature). Metal-oxide substrate 30 may comprise any suitable metal-oxide material or combinations of metal-oxide materials. Substrate 30 preferably comprises alumina, and may be formed by a green sheet fabrication process conventionally used to form ceramic substrates. Also as before, substrate 30 may have the above-described typical and preferred thickness values. In preferred embodiments of package 100, the size of metal-oxide substrate 30 is substantially the same as the surface area of major portion 121 of die clip 120, but it can be larger. Package 100 further comprises a heat sink 20 as previously described, with its mounting surface 21 disposed over the second surface 32 of metal-oxide substrate 30. A layer of thermally conductive adhesive or thermally conductive grease may be disposed between the substrate's first surface 31 and the die clip's major portion 121, and another layer of thermally conductive adhesive or thermally conductive grease may be disposed between the substrate's second surface 32 and the heat sink's mounting surface 21. (In another option, although more expensive, one or both surfaces of substrate 30 may be metalized, and the substrate may be attached to one or both of the die clip and heat sink with solder.)

Figure 7:
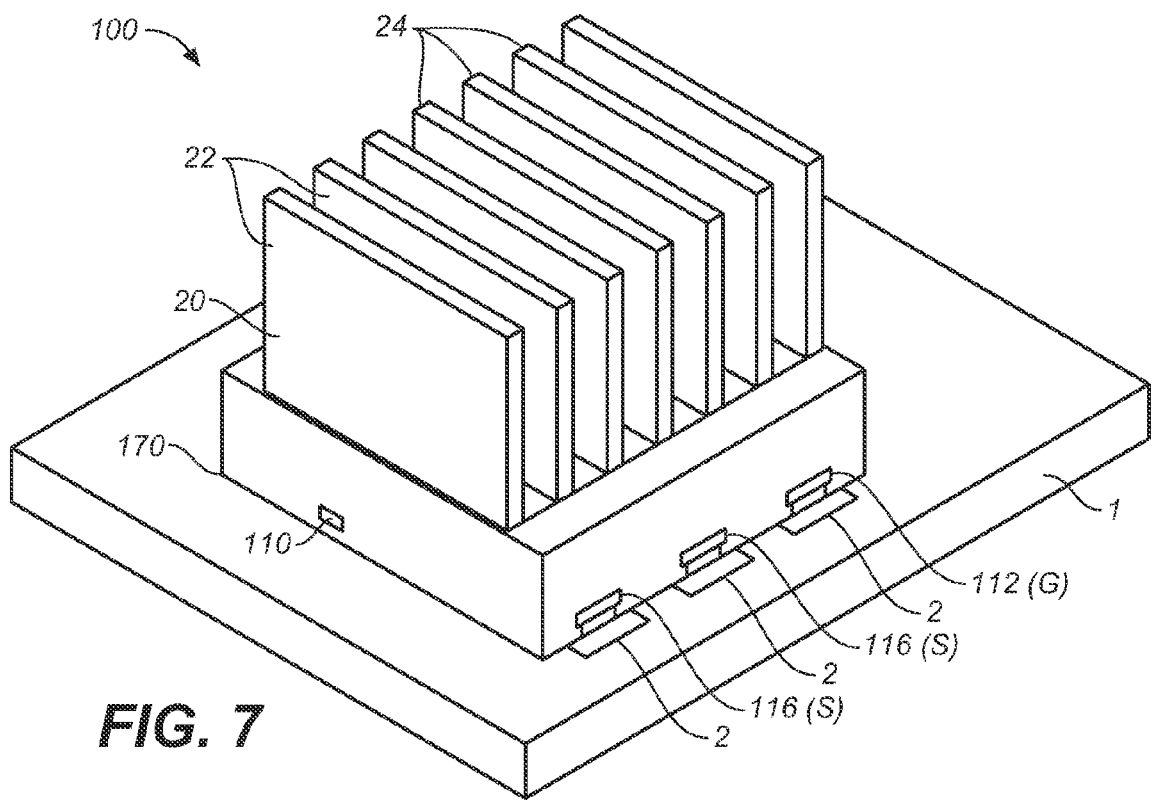
FIG. 7 shows a top perspective view of the second exemplary semiconductor die package, in assembled form, as attached to an interconnect substrate of a system according to the present invention.
Figure 8:
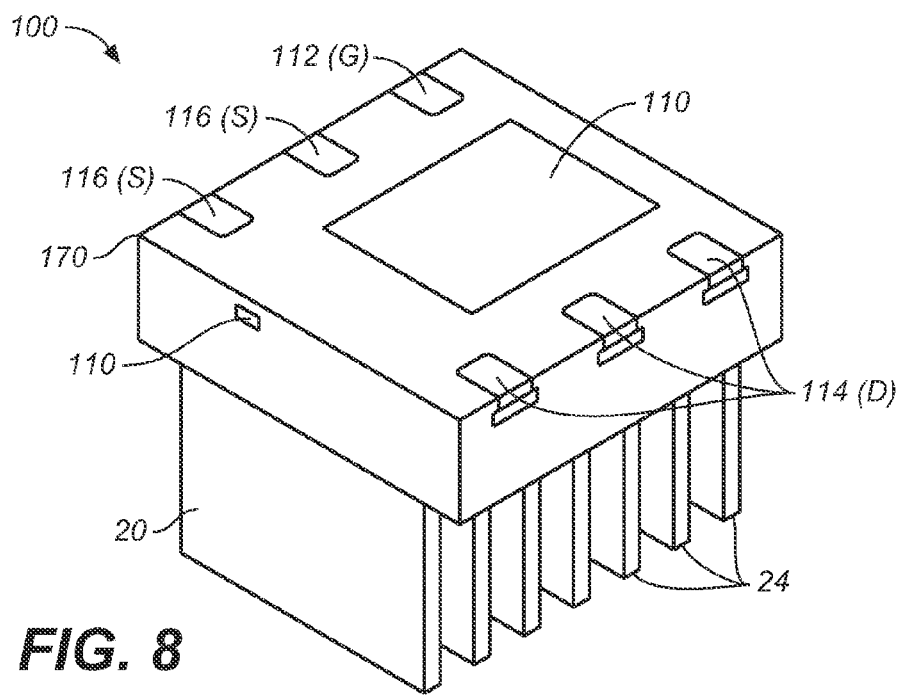
FIG. 8 shows a bottom perspective view of the second exemplary semiconductor die package, in assembled form, according to the present invention.

FIG. 7 shows a top perspective view of semiconductor die package 100, in assembled form and as attached to interconnect substrate 1 (previously described), and after a body of electrically insulating material has been formed around leadframe 110, semiconductor die 55, die clip 120, and substrate 30 to form a housing 170. This locks die-clip 120 and substrate 30 in place in the case that no adhesive has been used to assemble these two components. Housing 170 may also be formed to cover portions of the base of heat sink 20; this can lock heat sink 20 and substrate 30 in place in the case that no adhesive has been used to attach these two components. The other reference numbers in FIG. 7 have been previously described above. FIG. 8 shows a bottom perspective view of package 100, where it can be seen that a major portion of leadframe 110 is exposed, which provides a large attachment area for package 100 to be attached to an external board, and also increases heat conductivity to an external board. Referring back to FIG. 7, there are corresponding pads 2 on interconnect substrate 1 to which conductive regions 112-116 and the exposed portion of leadframe 110 are attached.

In exemplary manufacturing methods, die 55, leadframe 110, and die clip 120 are first assembled together as a die sub-assembly. Various exemplary sequences for assembling these components into the die sub-assembly have been previously described. Then, in a second assembly phase, the die sub-assembly, metal-oxide substrate 30, and heat sink 20 are assembled together, with substrate 30 disposed over the die sub-assembly, and heat sink 20 disposed over substrate 30. Thereafter, housing 170 is formed. Adhesive (preferably thermally conductive adhesive) or thermally conductive grease may be disposed between two or more of the components during the second assembly phase. In one implementation of the second assembly phase, substrate 30 and the die sub-assembly are aligned and attached together, then heat sink 20 and substrate 30 are aligned and attached together, and then housing 170 is formed. In another implementation of the second assembly phase, substrate 30 and heat sink 20 are aligned and attached together, then substrate 30 and the die sub-assembly are aligned and attached together, and then housing 170 is formed. In yet another assembly implementation, heat sink 20, substrate 30, and the die sub-assembly are aligned, and then simultaneously attached together, followed by the formation of housing 170. As yet another implementation, heat sink 20, substrate 30, and the die sub-assembly are aligned and placed in their relative positions, and then housing 170 is formed to lock them in place.

Figure 9:
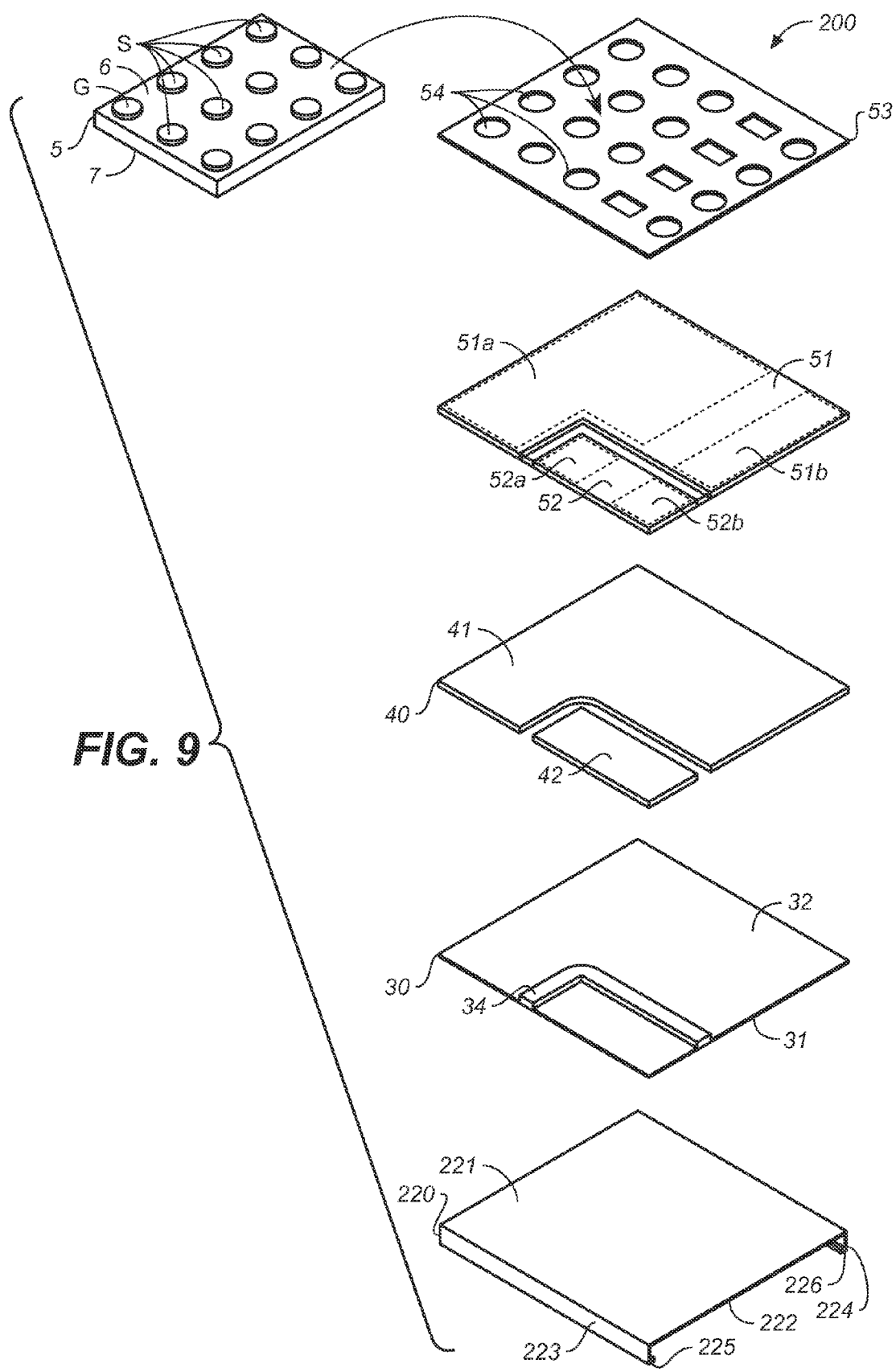
FIG. 9 shows an exploded perspective view of a third embodiment of a semiconductor die package according to the present invention.

FIG. 9 shows exploded perspective view of a third embodiment of a semiconductor die package 200 according to the present invention. Package 200 comprises the same components as package 10, disposed and configured in the same ways and with the same possible variations, except that the heat sink of package 10 is replaced by a heat-sink adaptor plate 220, and that the first surface 31 of metal-oxide substrate 30 is disposed over a mounting surface 221 of adaptor plate 220. Adaptor plate 220 comprises an adaptor surface 222 opposite to its mounting surface 221, a first wall 223 having a bottom side disposed on adaptor surface 222 at one side of plate 220, and a second wall 224 having a bottom side disposed on adaptor surface 222 at another side of plate 220 opposite to first wall 224. Each wall has a top side opposite to its bottom surface, and adapter plate 220 further comprises a first lip 225 disposed at the top side of first wall 223 and facing toward second wall 224, and a second lip 226 disposed at the top side of second wall 224 and facing toward first wall 223. Walls 223-224 and lips 225-226 define a channel into which a heat sink may be slid (illustrated below in FIG. 12). Adaptor plate 220 may comprise a metallic material, such as aluminum or an aluminum alloy.

Figure 10:
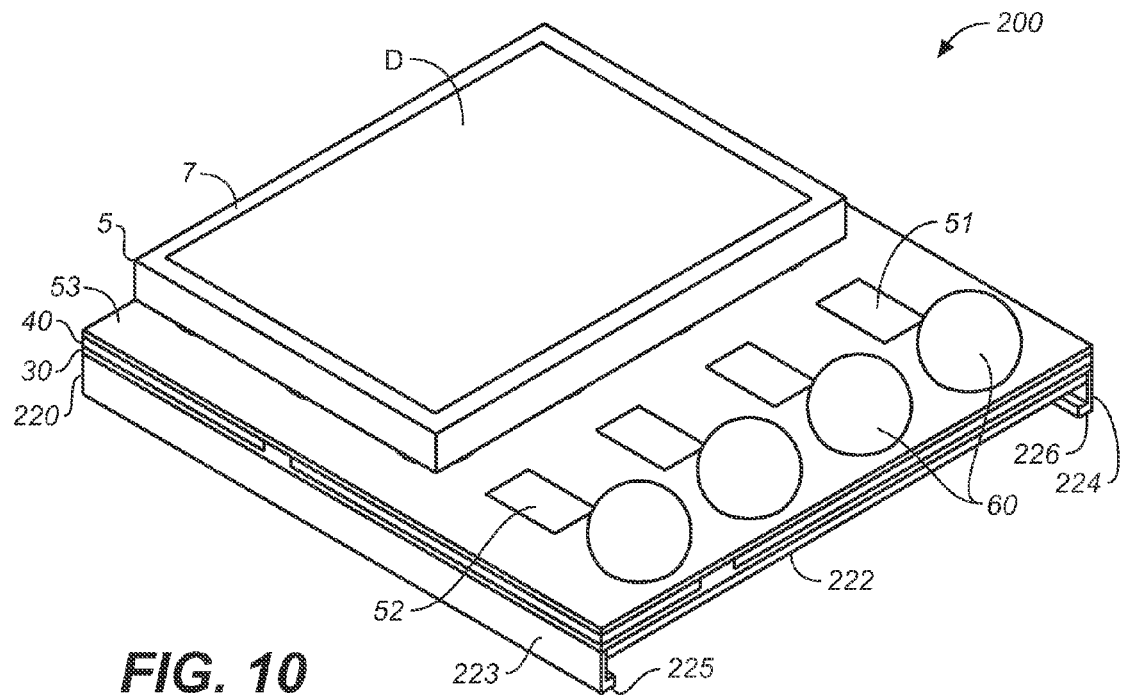
FIG. 10 shows a perspective view of the third exemplary semiconductor die package, in assembled form, according to the present invention.
Figure 11:
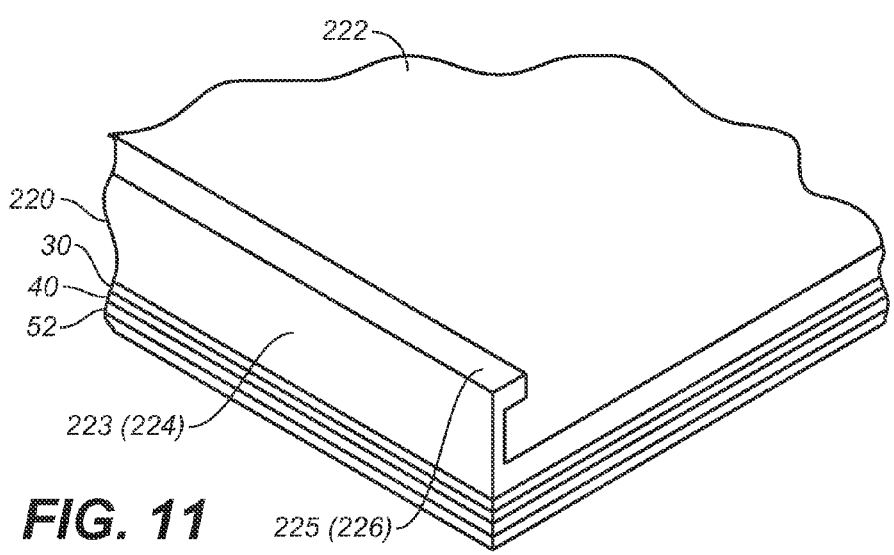
FIG. 11 shows a close-up view of the wall and lip structure of the third exemplary semiconductor die package according to the present invention.
Figure 12:
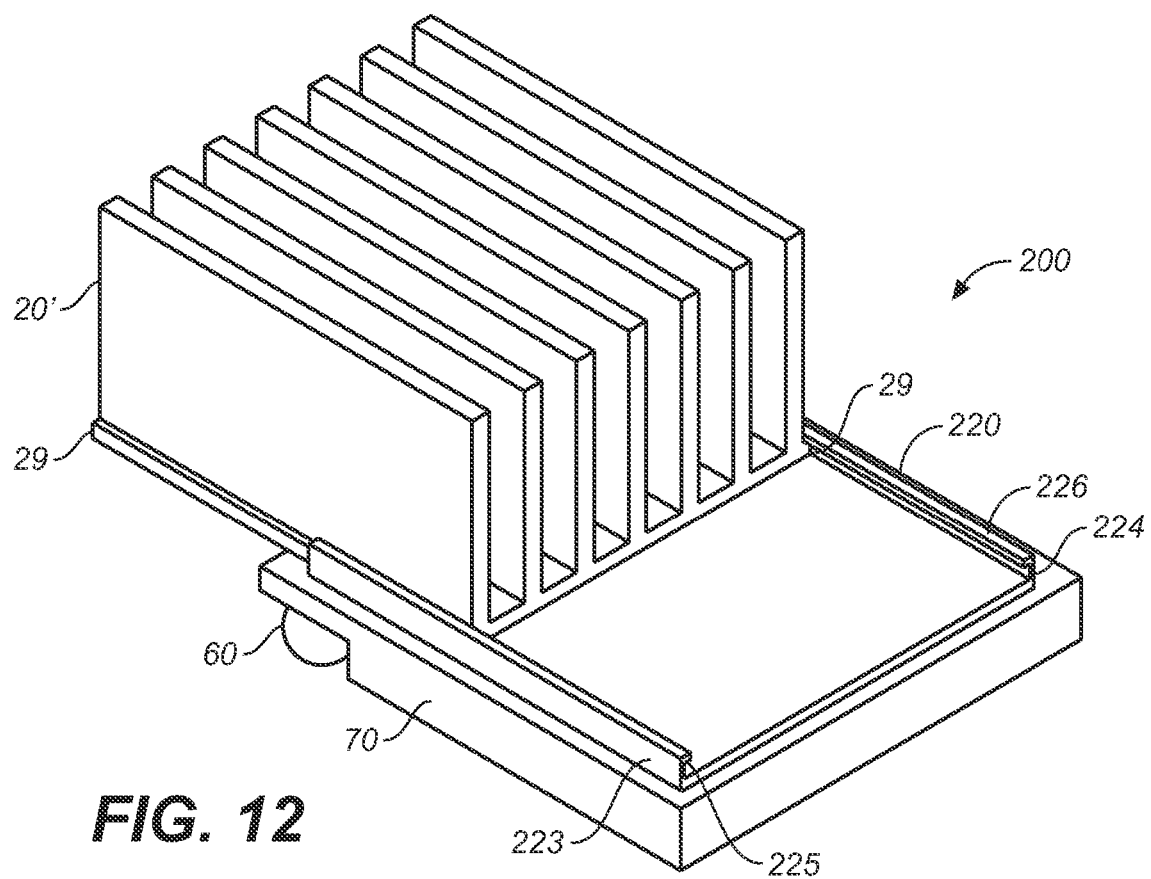
FIG. 12 shows a top perspective view of the third exemplary semiconductor die package, in assembled form, according to the present invention.

FIG. 10 shows a perspective view of semiconductor die package 200, in assembled form, and where solder bumps 60 have been adhered to the portions 51*b* and 52*b* of the traces that have been exposed by solder mask 53. In a typical assembly sequence, components 30-53 are first assembled, then semiconductor die 5 is attached to traces 51 and 52, and this assembly is then disposed on heat-sink adaptor plate 220. FIG. 11 shows a close-up view of the wall and lip structure of adaptor plate 220. FIG. 12 shows a perspective view of semiconductor die package 200 after a body of electrically insulating material has been formed around substrate 30 and die 5 to form a housing 70. Housing 70 preferably leaves conductive region D (or conductive region S in other implementations) on the die's second surface 7 exposed so that electrical contact may be made to it. Housing 70 may also be formed to cover portions of the base of adapter plate 220; this can lock adapter plate 220 and substrate 30 in place in the case that no adhesive has been used to assemble these two components. FIG. 12 also shows a perspective view of a heat sink 20' being interfaced to adaptor plate 220 of package 200. Heat sink 20' may comprise the same heat sink 20 described above with respect to package 10, except that heat sink 20' further comprises rims 29 that interfit with the walls 223-224 and lips 225-226 of adaptor plate 220.

Package 200 may be attached to interconnect substrate 1 in the same way as package 10, as shown in FIG. 4. A number of variations of package 200 are possible. As a first variation, lips 225-226 may be omitted, and walls 223-224 may be tilted toward one another to define a channel into which heat sink 20' may slide. Rims 29 of heat sink 20' may be tapered to match the inward tilt of walls 223-224, or the distance between walls 223 and 224 may be increased slightly to account for the inward tilt. As another variation, walls 223-224 may be maintained perpendicular to adaptor surface 222, or may be removed, and a heat sink may be attached to adaptor surface 222 with adhesive (preferably thermally conductive adhesive). As yet another variation, adaptor plate 220 may comprise a plurality of parallel, dovetail-shaped ridges (or grooves) that interfit with a corresponding plurality of dove-tailed-shaped grooves (or ridges) of a heat sink.

Package 200 may be manufactured using the same methods described above for package 10, except that adaptor plate 220 is used in place of heat sink 20. These methods also include those in which traces 51 and 52 are provided by a leadframe. In the appended apparatus and method claims, the term "heat-sinking component" includes both heat sinks and heat-sink adaptor plates.

Figure 13:
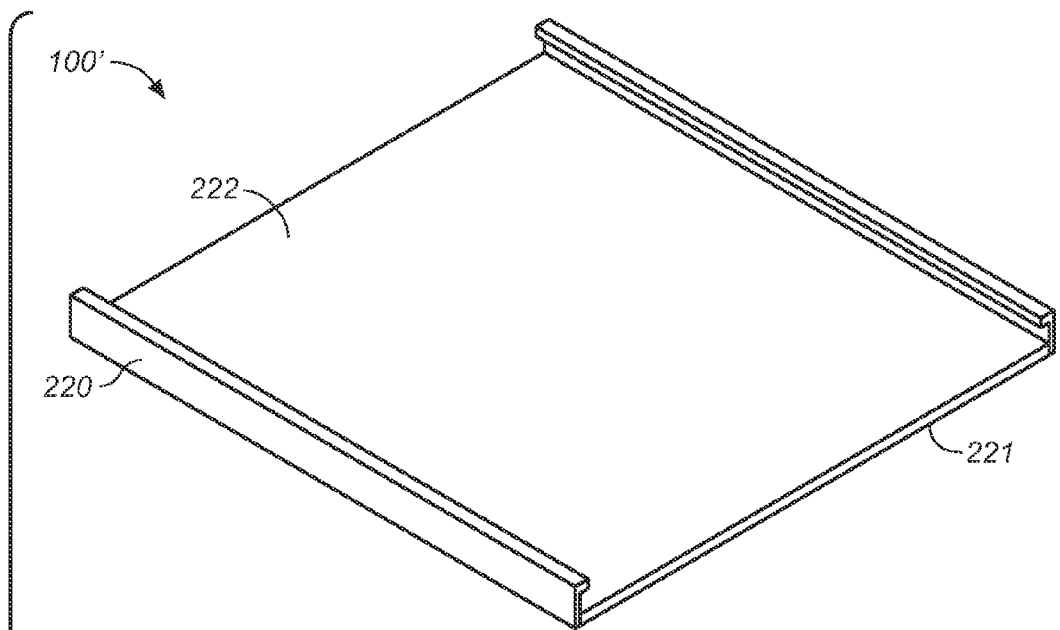
FIG. 13 shows an exploded perspective view of a fourth exemplary semiconductor die package, in assembled form, according to the present invention.
Figure 13:
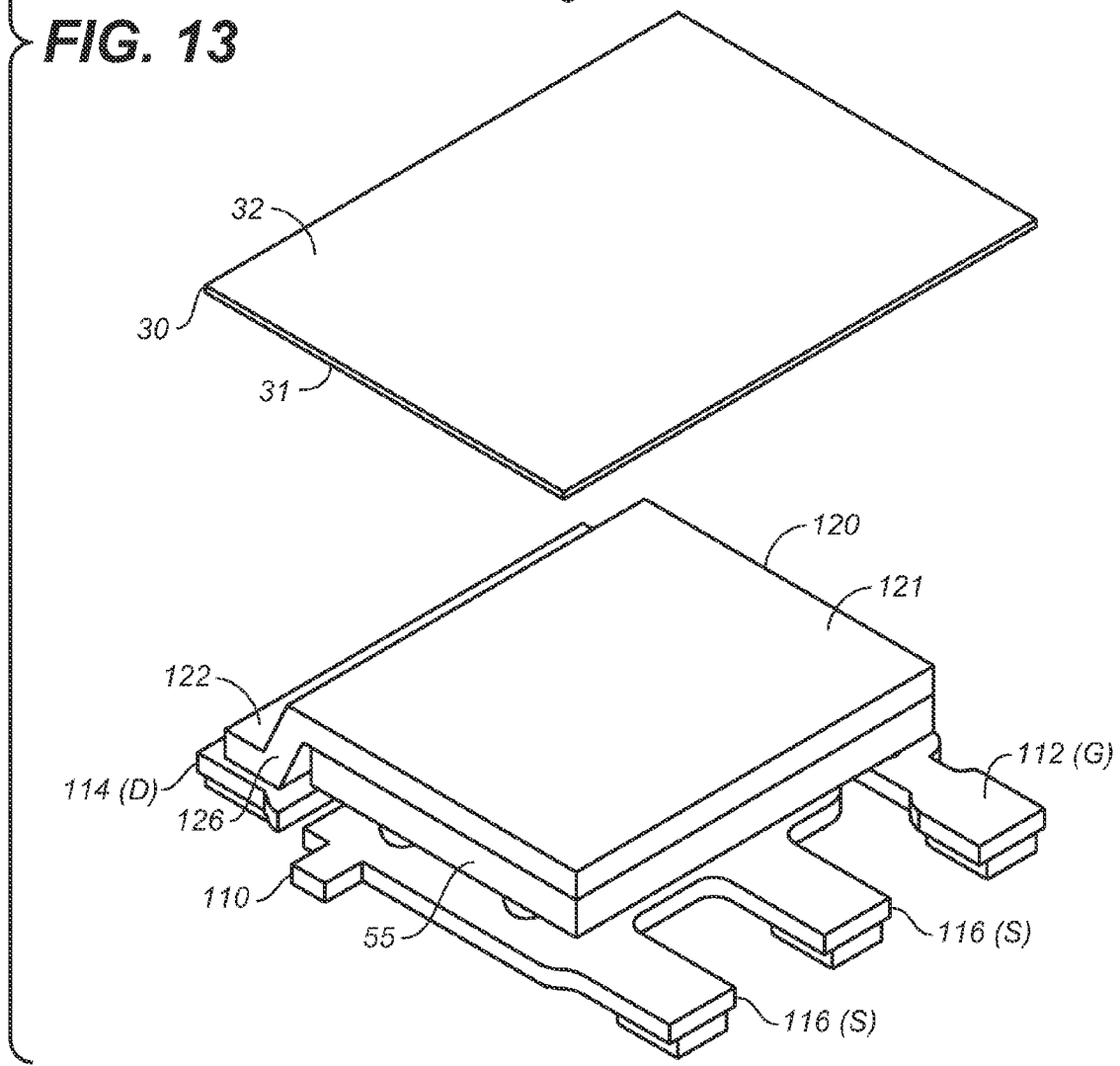

In a similar manner, package 100 may be constructed and manufactured with a heat-sink adaptor plate 220 instead of a heat sink, as illustrated by the first sub-assembly of package 100' in FIG. 13.

Figure 14:
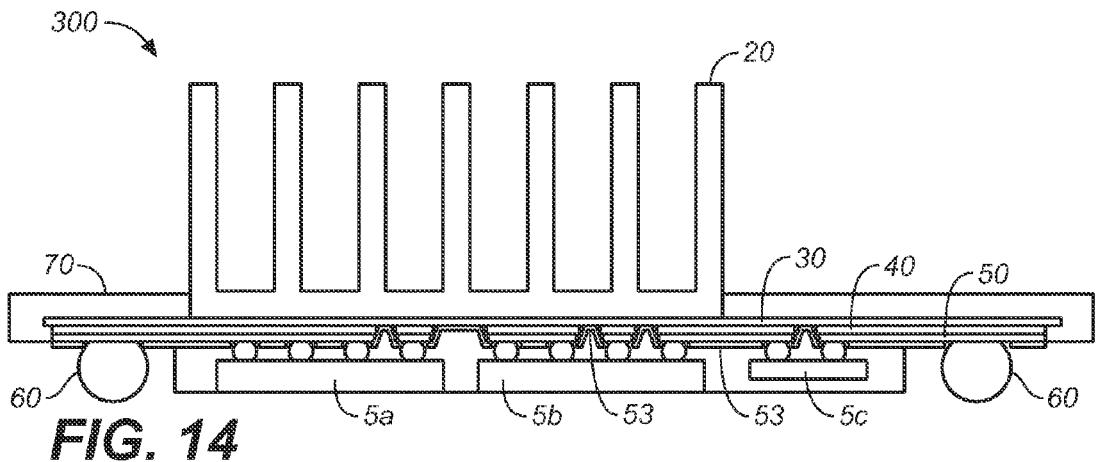
FIGS. 14-16 show cross-sectional views of exemplary multi-chip embodiments of semiconductor die package according to the present invention.

Multi-Chip Module embodiment. Each of the above embodiments may be configured to include additional semiconductor dice to provide multi-chip modules (MCM) with integrated heat-sinking capability. FIG. 14 is a cross-sectional view of an MCM package 300 that has the same construction and possible variations as package 10, except that package 300 includes three semiconductor dice 5a, 5b, and 5c instead of one die 5, and includes additional electrical traces, which are generally shown by reference number 50 in the figure. The other reference numbers in the figure point to like elements of package 10 previously described. Each of dice 5a and 5b has a first surface, a second surface, a first electrically conductive region disposed on the die's first surface, and a second electrically conductive region disposed on the die's second surface. Each of dice 5a and 5b is disposed over metal-oxide substrate 30 such that its first electrically conductive region is electrically coupled to an electrical trace of trace layer 50. Third die 5c may have this same configuration, or may only have its conductive regions disposed on its top surface for contact to traces on layer 50. It may be appreciated that heat-sink adaptor plate 220 may be used in place of heat sink 20 in package 300.

In one implementation of package 300, which may be a so-called "smart power module," dice 5a and 5b may comprise semiconductor power devices that switch or regulate the flow of power, and semiconductor die 5c may comprise control circuitry, such as a pulse-width modulator, that sends control signals to the modulation terminals of the power devices on dice 5a and 5b. Such a smart power module may, for example, be used in a switching power supply where one of dice 5a and 5b selectively directs power to an inductor, and the other selectively directs the inductor's stored power to a load or selectively couples the inductor to a free-wheeling discharge path. As with package 10, the back surfaces of dice 5a and 5b are left exposed by housing 70 so that electrical regions at these back surfaces may be electrically coupled to corresponding conductive regions of an interconnect board, such as board 1 shown in FIGS. 4 and 7. When die 5c comprises control circuitry, it may have all of its contacts on its top surface, and need not have its back surface left exposed by housing 70.

Figure 15:
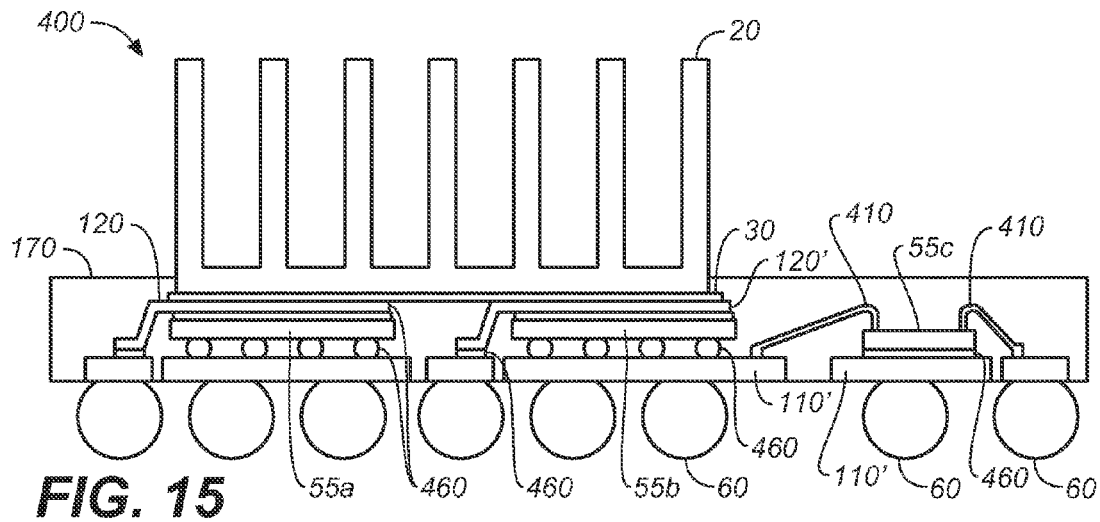

FIG. 15 is a cross-sectional view of an MCM package 400 that has the same construction and possible variations as package 100, except that package 400 includes three semiconductor dice 55a, 55b, and 55c instead of one die 55, includes an additional drain clip 120' and wire interconnects 410 for die 55c, and includes an expanded leadframe 110' having additional traces and conductive regions compared to leadframe 110. The other reference numbers in the figure point to like elements of package 100 previously described. Each of dice 55a and 55b has a first surface, a second surface, a first electrically conductive region disposed on the die's first surface, and a second electrically conductive region disposed on the die's second surface. Each of dice 55a and 55b is disposed over leadframe 110' such that the die's first electrically conductive region is electrically coupled to an electrically conductive region of the leadframe. In addition, die clips 120 and 120' are disposed between respective dice 55a and 55b on the one hand, and metal-oxide substrate 30 on the other, where the major portions of the die clips are electrically coupled to the second electrically conducive regions of dice 55a and 55b, and the minor portions are electrically coupled to conductive regions of leadframe 110'. Individual bodies of solder 460 may be used to provide the aforementioned electrically couplings among the dice, die clips, and leadframe. Die 55c may have this same configuration, or may have the configuration shown in FIG. 15 where connections between conductive regions at its top surface and leadframe 110' are made with conductive structures 410, which may include wire bonds, tab bond, and the like. It may be appreciated that heat-sink adaptor plate 220 may be used in place of heat sink 20 in package 400, and that package 400 may be configured as a smart power package, where dice 55a and 55b comprise power devices and die 55c comprises control circuitry.

Figure 16:
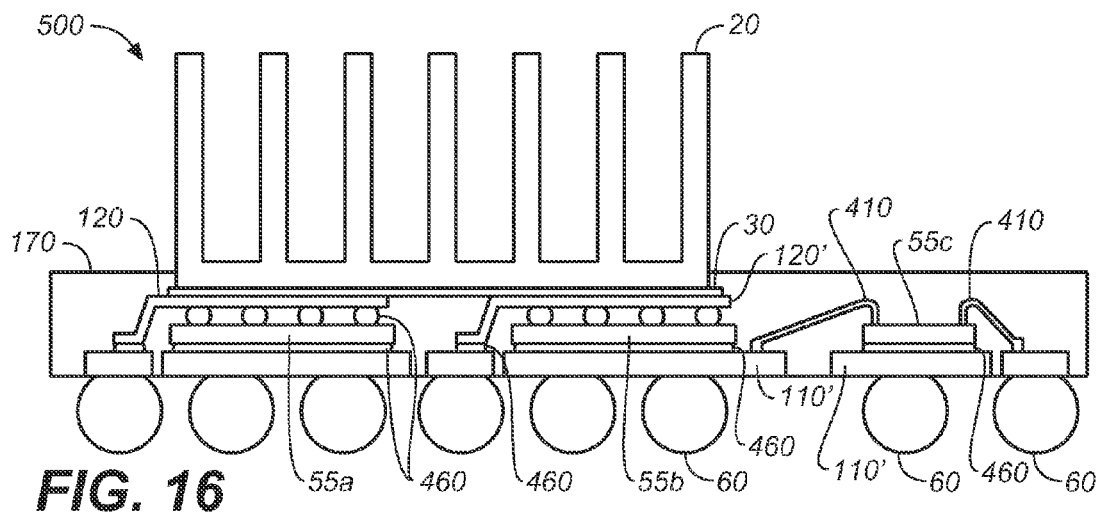

The exemplary embodiments of packages 100 and 400 have shown dice 55a and 55b positioned so that their surfaces with the large conductive regions are disposed against respective die clips 120 and 120', and so that their surface with the smaller (and more numerous) conductive regions are disposed against leadframes 110 and 110'. This may be called the "drain-side-up" configuration when die 55a-55b comprise power MOSFET devices. It may be appreciated that the orientation of die 55a-55b may be flipped so that their surfaces with the large conductive regions are disposed against leadframes 110 and 110', and so that their surfaces with the smaller conductive regions are disposed against respective die clips 120 and 120'. This may be called the "source-side-up" configuration when the 55a-55b comprise power MOSFET devices. If other terminals, such as gate terminals and modulation terminals are also provided on the upper surfaces of dice 55a-55b, and they have to be electrically isolated from drain clips 120 and 120', connections between these other terminals and leadframe 100' may be made with additional (typically smaller) die clips, wire bonds, tab bonds, or other types of conductive structures. A package embodiment 500 with this configuration is shown in FIG. 16 and is self-explanatory in view of the description of package 400.

The semiconductor die packages described above can be used in electrical assemblies including circuit boards with the packages mounted thereon. They may also be used in systems such as phones, computers, etc.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

While the present invention has been particularly described with respect to the illustrated embodiments, it will be appreciated that various alterations, modifications, adaptations, and equivalent arrangements may be made based on the present disclosure, and are intended to be within the scope of the invention and the appended claims.

What is claimed is:

1. A semiconductor die package comprising:
   a leadframe having a first conductive region and a second conductive region electrically isolated from the first conductive region;
   a semiconductor die having a first surface, a second surface, a first electrically conductive region disposed on the die's first surface, and second electrically conductive region disposed on the die's second surface, wherein the die is disposed over the leadframe such that the die's first electrically conductive region is electrically coupled to the leadframe's first electrically conductive region;
   a die clip having a major portion, a minor portion, and a bridge portion between the major and minor portions, the major portion having a first surface disposed over the second surface of the semiconductor die and electrically coupled thereto, and a second surface opposite to its first surface, the minor portion having a first surface disposed over the second conductive region of the leadframe and electrically coupled thereto, and a second surface opposite to its first surface;
   a metal-oxide substrate having a first surface and a second surface, the second surface being disposed over the second surface of the major portion of the die clip; and
   a heat-sinking component having a mounting surface disposed over the first surface of the metal-oxide layer and a second surface.

2. The semiconductor die package of claim 1 wherein the metal-oxide substrate has a thermal conductivity of at least 5 W/m·°K, as measured at a temperature of 300° K.

3. The semiconductor die package of claim 1 wherein the metal-oxide substrate comprises alumina.

4. The semiconductor die package of claim 1 wherein the leadframe comprises copper.

5. The semiconductor die package of claim 1 wherein the metal-oxide substrate has a thickness in the range of about 0.1 millimeters to about 1 millimeter.

6. The semiconductor die package of claim 1 further comprising a body of electrically insulating material disposed around the leadframe, the semiconductor die, the die clip, and the metal-oxide substrate, with at least a portion of the leadframe being exposed.

7. The semiconductor die package of claim 1 wherein the heat-sinking component comprises a heat sink, wherein the second surface of the heat sink comprises a plurality of fins extending away from the mounting surface in a direction generally perpendicular to the plane of the mounting surface, with the horizontal extent of the fins being substantially within the planar extent of the mounting surface.

8. The semiconductor die package of claim 1, wherein the leadframe further has a third conductive region, and wherein the package further comprises a second semiconductor die having a first surface, a second surface, a first electrically conductive region disposed on the die's first surface, and second electrically conductive region disposed on the die's second surface, wherein the second die is disposed over the leadframe such that the die's first electrically conductive region is electrically coupled to the leadframe's third electrically conductive region.

9. A system comprising an interconnect substrate and the semiconductor die package of claim 1 attached to the interconnect substrate.

* * * * *